United States Patent
Makino

(10) Patent No.: US 11,205,881 B2
(45) Date of Patent: Dec. 21, 2021

(54) CONNECTOR-FITTING STRUCTURE OF FLEXIBLE PRINTED CIRCUIT

(71) Applicant: Yazaki Corporation, Tokyo (JP)

(72) Inventor: Kimitoshi Makino, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/516,346

(22) Filed: Jul. 19, 2019

(65) Prior Publication Data

US 2020/0028306 A1 Jan. 23, 2020

(30) Foreign Application Priority Data

Jul. 23, 2018 (JP) .............................. JP2018-137496

(51) Int. Cl.
| | | |
|---|---|---|
| *H01R 13/68* | (2011.01) | |
| *H01R 13/696* | (2011.01) | |
| *H05K 1/11* | (2006.01) | |
| *H05K 1/18* | (2006.01) | |

(52) U.S. Cl.
CPC .......... *H01R 13/696* (2013.01); *H05K 1/118* (2013.01); *H05K 1/181* (2013.01); *H05K 1/189* (2013.01); *H05K 2201/10181* (2013.01)

(58) Field of Classification Search
CPC .............. H01R 13/696; H01R 13/6272; H01R 13/6275; H01R 12/79; H01R 12/592; H01R 12/78; H05K 1/118; H05K 1/181; H05K 2201/10181
USPC ........ 439/352, 357, 358, 492, 494–496, 499
See application file for complete search history.

(56) References Cited

U.S. PATENT DOCUMENTS

| | | | | | |
|---|---|---|---|---|---|
| 3,977,756 | A | * | 8/1976 | Rodondi | ................ H01R 12/62 439/357 |
| 3,999,826 | A | * | 12/1976 | Yurtin | .................. H01R 12/592 439/495 |
| 4,815,981 | A | * | 3/1989 | Mizuno | .................. H05K 1/118 439/77 |
| 4,948,378 | A | * | 8/1990 | Hoshino | .............. H01R 12/714 439/271 |
| 5,433,632 | A | * | 7/1995 | Cherney | .............. H01R 12/777 439/495 |
| 5,947,764 | A | * | 9/1999 | Pan | ......................... H01R 12/57 439/492 |
| 6,164,984 | A | * | 12/2000 | Schreiner | ............. H01Q 1/1271 439/86 |
| 6,234,820 | B1 | * | 5/2001 | Perino | ................ H01R 12/7005 439/326 |

(Continued)

FOREIGN PATENT DOCUMENTS

| | | |
|---|---|---|
| EP | 0793249 A2 | 9/1997 |
| JP | 2013-4185 A | 1/2013 |

(Continued)

*Primary Examiner* — Thanh Tam T Le
(74) *Attorney, Agent, or Firm* — Sughrue Mion, PLLC

(57) ABSTRACT

A connector-fitting structure of flexible printed circuit includes: a flexible printed circuit on which a wiring pattern is formed; an electronic component connected to the wiring pattern of the flexible printed circuit; and a connector to which one end part of the flexible printed circuit is fitted. The one end part of the flexible printed circuit is fitted to the connector to cause the electronic component to be housed in the connector.

13 Claims, 4 Drawing Sheets

(56) References Cited

U.S. PATENT DOCUMENTS

| | | | | |
|---|---|---|---|---|
| 6,299,469 B1* | 10/2001 | Glovatsky | ............... | F02D 9/02 |
| | | | | 439/329 |
| 6,333,467 B1* | 12/2001 | Matsuo | ............... | H01R 12/592 |
| | | | | 174/250 |
| 6,454,573 B2* | 9/2002 | Hayashi | ............... | H01R 12/721 |
| | | | | 439/492 |
| 6,729,888 B2* | 5/2004 | Imaeda | ............... | G02F 1/13452 |
| | | | | 439/66 |
| 6,753,477 B1* | 6/2004 | Sinkunas | ............ | H01R 12/613 |
| | | | | 174/117 FF |
| 6,755,683 B2* | 6/2004 | Roberts | ................. | H01R 12/79 |
| | | | | 439/496 |
| 6,960,094 B2* | 11/2005 | Tomonari | ............... | H01R 12/79 |
| | | | | 439/329 |
| 7,004,794 B2* | 2/2006 | Wang | ............... | G06K 19/07732 |
| | | | | 439/660 |
| 7,108,515 B2* | 9/2006 | Tanabe | ................. | H05K 1/118 |
| | | | | 349/150 |
| 7,341,476 B2* | 3/2008 | Soeta | ..................... | H01R 12/61 |
| | | | | 439/493 |
| 7,455,552 B1* | 11/2008 | Fang | ..................... | H05K 3/284 |
| | | | | 439/606 |
| 7,618,283 B1* | 11/2009 | Costello | ............... | H01R 12/585 |
| | | | | 439/511 |
| 7,649,742 B2* | 1/2010 | Ni | ........................ | H05K 5/0269 |
| | | | | 174/520 |
| 7,896,660 B2* | 3/2011 | Tochi | ................. | H01R 13/6594 |
| | | | | 439/78 |
| 7,916,486 B2* | 3/2011 | Takahashi | .............. | H01R 12/79 |
| | | | | 361/720 |
| 7,988,465 B2* | 8/2011 | Chuo | ................... | H05K 1/0218 |
| | | | | 439/98 |
| 8,242,374 B2* | 8/2012 | Chuo | .................... | H05K 1/118 |
| | | | | 174/250 |
| 8,529,286 B2* | 9/2013 | Su | ........................ | H01R 13/506 |
| | | | | 439/495 |
| 8,619,413 B2* | 12/2013 | Gausepohl | ......... | H01R 13/6675 |
| | | | | 361/623 |
| 8,708,711 B2* | 4/2014 | Horikawa | .............. | H01R 12/52 |
| | | | | 439/66 |
| 8,727,794 B2* | 5/2014 | Tanaka | ................... | H05K 5/064 |
| | | | | 439/76.1 |
| 9,066,455 B2* | 6/2015 | Takaura | ................ | H05K 3/242 |
| 9,077,168 B2* | 7/2015 | Lin | ...................... | H05K 1/0219 |
| 9,999,133 B2* | 6/2018 | Cho | ...................... | H05K 1/113 |
| 2008/0084520 A1* | 4/2008 | Nam | .................... | G02B 6/0068 |
| | | | | 349/65 |
| 2012/0184142 A1 | 7/2012 | Furukawa | | |
| 2018/0088179 A1* | 3/2018 | Ota | ....................... | H01R 12/592 |

FOREIGN PATENT DOCUMENTS

| | | |
|---|---|---|
| JP | 2013-80693 A | 5/2013 |
| JP | 2013-152918 A | 8/2013 |
| JP | 2017-123280 A | 7/2017 |
| WO | 2011/043488 A1 | 4/2011 |

* cited by examiner

11,205,881 B2

CONNECTOR-FITTING STRUCTURE OF FLEXIBLE PRINTED CIRCUIT

CROSS-REFERENCE TO RELATED APPLICATION

The present application is based on, and claims priority from Japanese Patent Application No. 2018-137496, filed on Jul. 23, 2018, the entire contents of which are incorporated herein by reference.

TECHNICAL FIELD

The disclosure relates to a connector-fitting structure of flexible printed circuit.

BACKGROUND

As a battery module that does not cause fuses of a vehicle, such as a hybrid electric vehicle (HEV) or an electric vehicle (EV), to blow out, known is a module disclosed in JP 2017-123280 A. In this known battery module, fuses as electronic components are connected to wiring patterns formed on a circuit board by soldering. The circuit board, to which the fuses are connected, is connected through bus bars to electrode terminals of individual battery cells arranged in series, and is further connected through a connector to a battery monitoring unit for detecting the capacity (and/or voltage) of each of the battery cells to monitor the battery cells in order to keep the safety of the battery cells.

SUMMARY

However, about the known circuit board in which the fuses are respectively connected to the wiring patterns, it is feared that the circuit board is bent or vibrated by, for example, vibrations of the vehicle while the vehicle is driving, so that the fuses are peeled from the wiring patterns, to which the fuses are connected.

The present application has been made to solve the above-mentioned problems, and an object thereof is to provide a connector-fitting structure of a flexible printed circuit about which an electric component can be surely prevented from being peeled from a wiring pattern to which the electric component is connected.

A connector-fitting structure of flexible printed circuit according to an embodiment includes a flexible printed circuit on which a wiring pattern is formed, an electronic component t connected to the wiring pattern of the flexible printed circuit, and a connector to which one end part of the flexible printed circuit is fitted. The one end part of the flexible printed circuit is fitted to the connector to cause the electronic component to be housed in the connector.

With the connector-fitting structure of flexible printed circuit according to the embodiment, the electronic component connected to the wiring pattern of the flexible printed circuit is housed in the connector. This matter makes it difficult that the electronic component is affected by the bending or vibrations of the flexible printed circuit, so that the electronic component can be surely prevented from being peeled from the wiring pattern, to which the electronic component is connected.

DETAILED DESCRIPTION

Hereinafter, an embodiment will be described with reference to the drawings.

Figure 1:
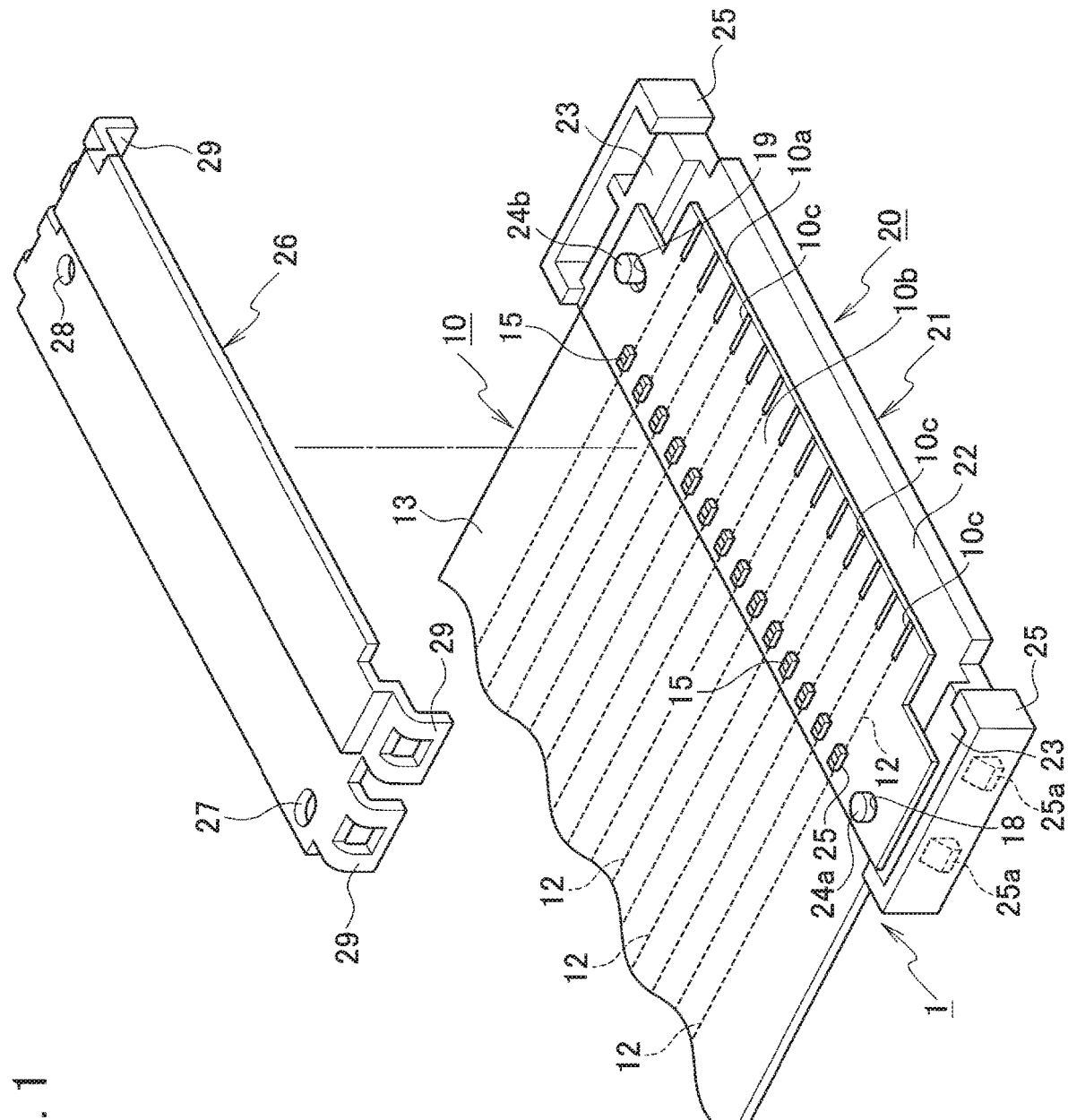
FIG. 1 is an exploded perspective view illustrating a connector-fitting structure of flexible printed circuit according to an embodiment.

As illustrated in FIG. 1, a connector-fitting structure 1 of a flexible printed circuit 10 includes the flexible printed circuit (FPC) 10 on which wiring patterns 12 are formed, chip fuses 15 as electronic components respectively connected to the wiring patterns 12 of the flexible printed circuit 10, and a connector 20 to which one end part 10b of the flexible printed circuit 10 is fitted.

Figure 3:
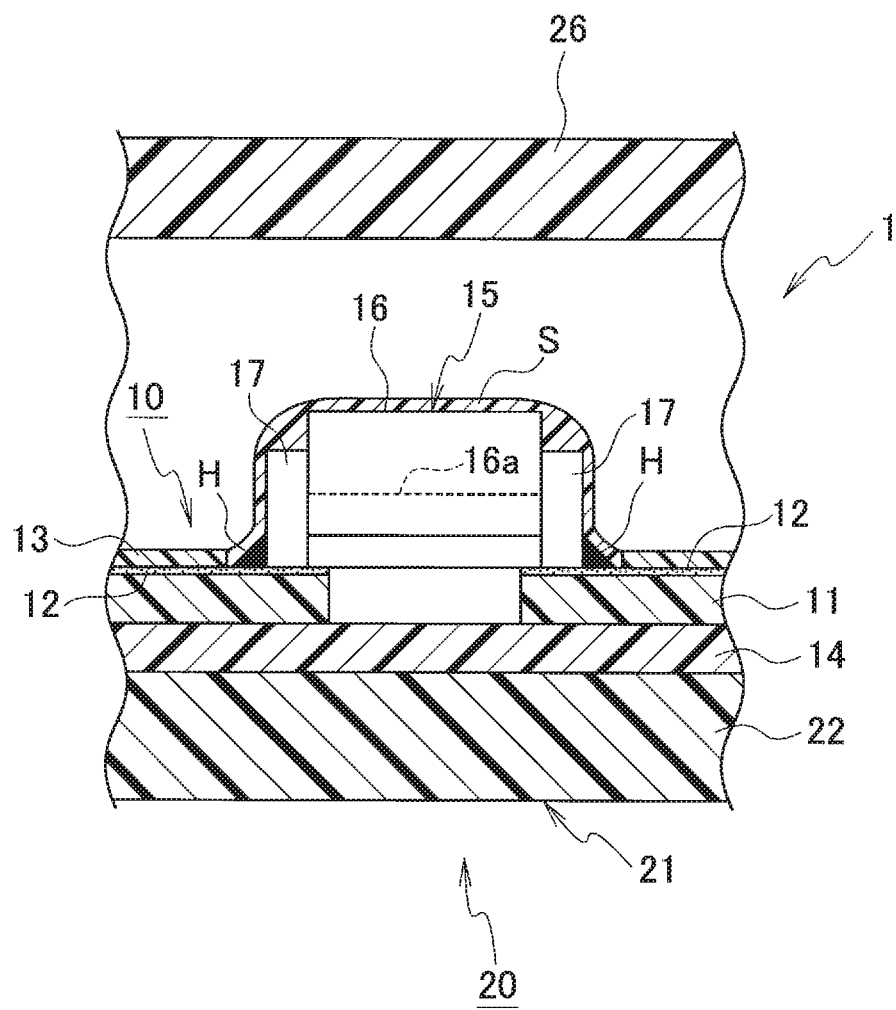
FIG. 3 is an enlarged sectional view illustrating a main portion of the connector-fitting structure of flexible printed circuit according to the embodiment.
Figure 4:
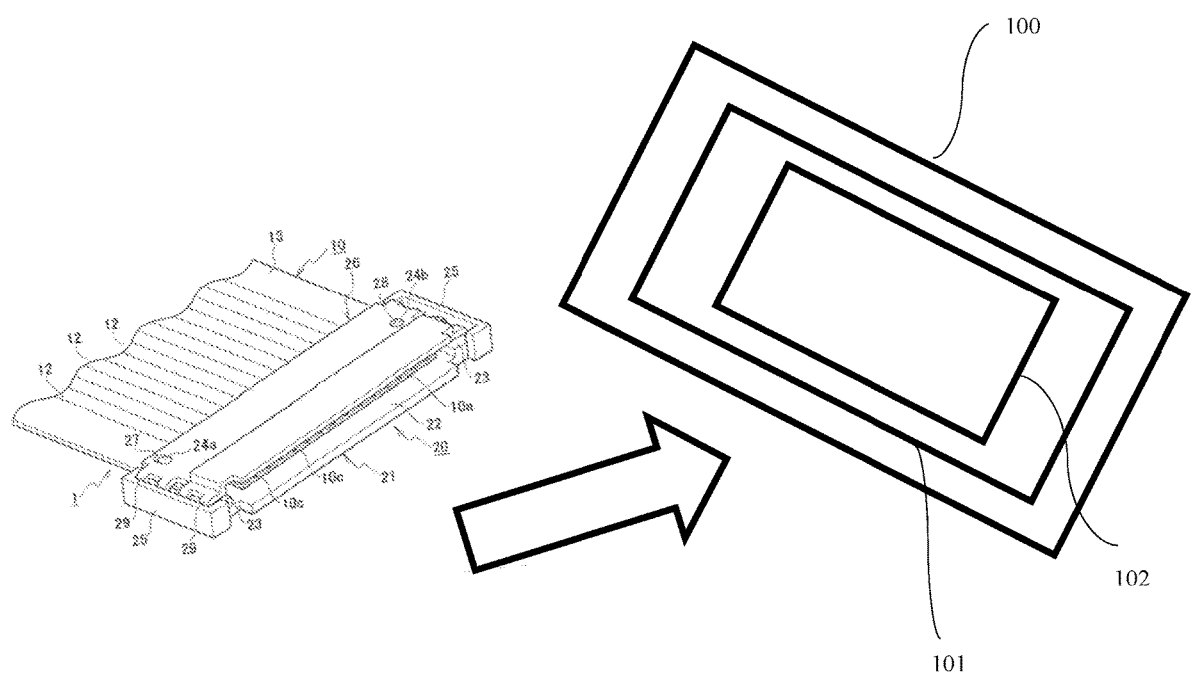
FIG. 4 is a perspective view illustrating the connector-fitting structure of flexible printed circuit according to the embodiment.

As illustrated in FIGS. 1 and 3, in the flexible printed circuit 10, a conductive metal, such as copper foil, is used to form the wiring patterns 12, as an electric circuit, onto a thin and a flexible base film 11 made of, for example, polyimide and having electric non-conductance, the wiring patterns 12 parallel to each other at intervals and be extended toward one end part 10a. The flexible printed circuit 10 is produced by using an adhesive to bond a film-form cover 13 made of, for example, polyimide onto the structure described just above. Each of the wiring patterns 12 is connected to a contact point portion 10c formed on the one end part 10a of the flexible printed circuit 10. As illustrated in FIG. 3, a reinforcing film 14 as a reinforcing plate is bonded onto the rear surface of the base film 11.

As illustrated in FIGS. 1 and 3, in the one end part 10b of the flexible printed circuit 10, a gap is made in each of the wiring patterns 12. A pair of fuse electrodes 17 positioned on both sides of a fuse body 16 of each of the chip fuses (electronic components) 15 is fixed to between moieties of each of the wiring patterns 12, the gap being put between the moieties, by soldering. The resultant soldered moieties are each represented by symbol H in FIG. 3. The chip fuse 15 is fitted to each of the wiring patterns 12 as follows: when a overcurrent flows into each of the wiring patterns 12, a conductive portion 16a in the fuse body 16 is broken to turn into an electric non-conductive state so that any current is insulated in the wiring pattern.

As illustrated in FIG. 3, each of the chip fuses 15, which is not covered with the film-form cover 13 of the flexible printed circuit 10, is sealed with a moisture-proof material (sealing material) S applied to the chip fuse 15. A circular positioning hole 18 and an elliptical positioning hole 19 are made in the one end part 10b of the flexible printed circuit 10 and on both sides of the one end part 10b, respectively. Each of the wiring patterns 12, which is extended toward the other end part side of the flexible printed circuit 10, is electrically connected, through a bus bar (not illustrated), to the corresponding one out of electrode terminals (not illustrated) of battery cells (not illustrated), which constitute a battery module (not illustrated).

Figure 2:
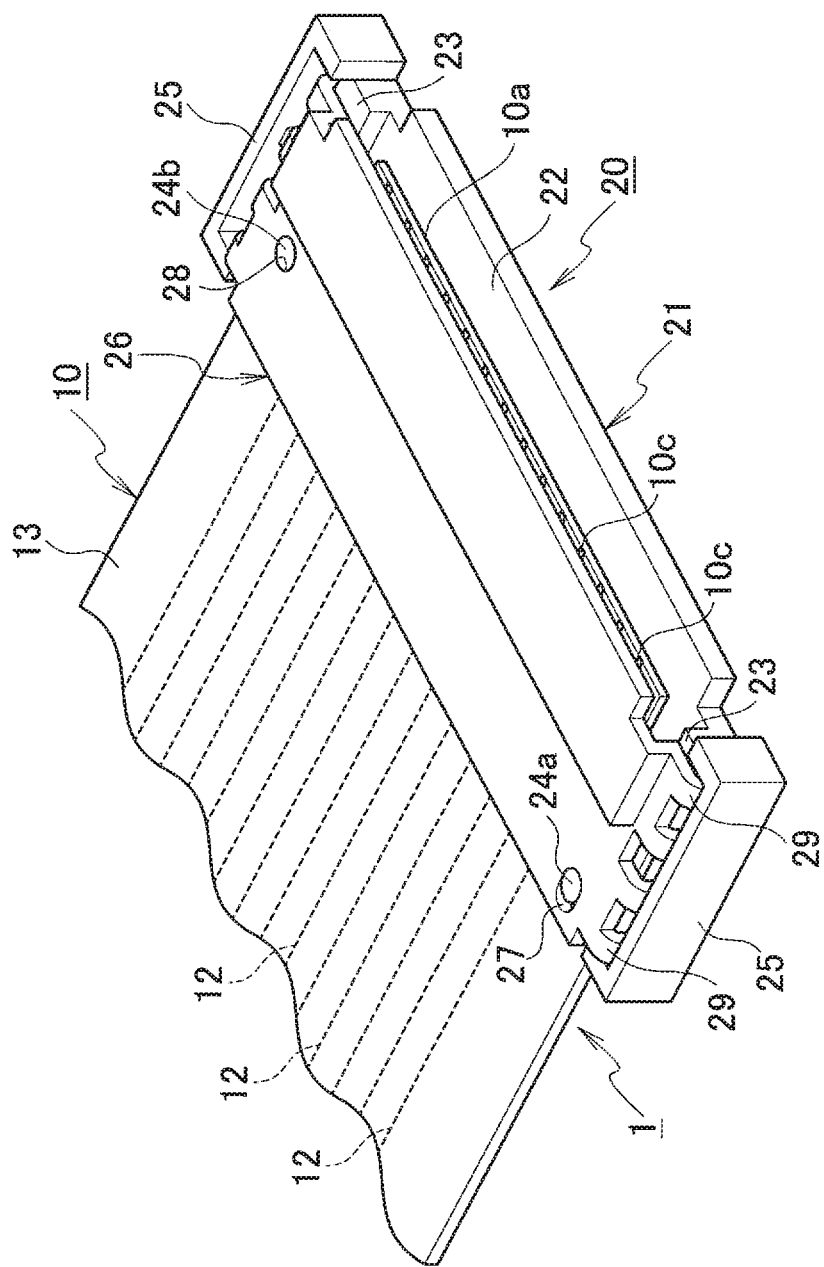
FIG. 2 is a perspective view illustrating the connector-fitting structure of flexible printed circuit according to the embodiment.

As illustrated in FIGS. 1 and 2, the connector 20 includes a connector housing 21 made of a synthetic resin, and a connector cover 26 that covers the connector housing 21 and is made of a synthetic resin.

The connector housing 21 includes a bottom-wall portion 22 in which the front side of the connector housing 21, which is positioned ahead of the center of the connector housing 21, is dented stepwise and downward, and a pair of side-wall portions 23 positioned, respectively, onto both sides of the bottom-wall portion 22. In a rear end side of one of the paired side-wall portions 23, a columnar first positioning pin 24a is formed to be projected from and integrated with this side-wall portion 23. At a position in the other side-wall portion 23 behind the center of the other side-wall portion 23, a columnar second positioning pin 24b is formed to be projected from and integrated with the other side-wall portion 23. The circular positioning hole 18 in the one end part 10b of the flexible printed circuit 10, and an elliptical positioning hole 27, which will be detailed later, in the connector cover 26 are fitted onto the first positioning pin 24a. The elliptical positioning hole 19 and an circular positioning hole 28, which will be detailed later, in the same side are fitted onto the second positioning pin 24b. In this way, the one end part 10b of the flexible printed circuit 10 is positioned by the rear of the connector housing 21 and the rear of the connector cover 26 so as to be put between the rears of the connector housing 21 and the connector cover 26, so that the individual chip fuses 15 are held between the connector housing 21 and the connector cover 26.

At the outside of each of the pair of side-wall portions 23 of the connector housing 21, a pair of locking plate portions 25, each of which is in a T-shaped form when viewed in plan, is formed. One of the locking plate portions 25 is projected from and integrated with of one of the side-wall portions 23. The other of the locking plate portions 25 is projected from and integrated with of the other of the side-wall portions 23. On the inner surface side of each of the locking plate portions 25, a pair of locking projections 25a for locking the closed state of the connector cover 26 is formed to be projected from and integrated with the locking plate portion 25.

As illustrated in FIGS. 1 and 2, the connector cover 26 is formed into a rectangular plate form such that the front side of the connector cover 26, which is positioned ahead of the center of the connector cover 26, is projected stepwise and upward. The elliptical positioning hole 27 is made on one side of the connector cover 26, and near the rear end of the connector cover 26. The circular positioning hole 28 is made on the other side of the connector cover 26 and near the center of the connector cover 27. In each side portion of the connector cover 26, a pair of locking portions 29 is formed to be projected from and integrated with the side portion in the manner of being downward extended into a frame form so as to be engaged with and released from the pair of locking projections 25a of the connector housing 21.

The connector 20, to which the one end part 10b of the flexible printed circuit 10 is fitted, is engaged with a partner connector (101) set into a battery monitoring unit (100). The following are then electrically connected to each other: each of the contact point portions 10c of the one end part 10a of the flexible printed circuit 10, which is naked from a space in front of the connector housing 21 and the connector cover 26 of the connector 20; and each 20 corresponding one out of contact point portions (102) of a circuit board inside the partner connector of the battery monitoring unit.

With the connector-fitting structure 1 of the flexible printed circuit 10 according to the embodiment, the chip fuses 15 connected to the respective wiring patterns 12 of the flexible printed circuit 10 are housed in an internal space between the connector housing 21 and the connector cover 26 of the connector 20, so as to be protected. This matter makes it difficult that the chips are affected by the bending or vibrations of the flexible printed circuit 10, so that the chip fuses 15 can be surely prevented from being peeled from the wiring patterns 12, to which the fuse chips are connected. In other words, even when the flexible printed circuit 10 is bent or vibrated by, for example, vibrations of a vehicle that is driving, the one end part 10b of the flexible printed circuit 10 inside the connector 20 is positioned by and put between the rear side of the pair of side-wall portions 23 of the connector housing 21, which is a side behind the center of the side-wall portions 23, and the rear side of the connector cover 26, which is a side behind the center of the connector cover 26. For this reason, the flexible printed circuit 10 is neither bent nor vibrated so that the soldered moieties H, which bond each of the wiring patterns 12 to the fuse electrodes 17 of each chip fuse 15 corresponding to the wiring pattern 12, are not peeled off. Consequently, the chip fuses 15 can be surely held and protected.

It is therefore unnecessary to fix the chip fuses 15 with a resin case which is a separate member, or protect the chip fuses separately with, for example, an EPT-sealer; and it is possible to save a space where the case or sealer is set. Thus, costs can be reduced accordingly.

In the connector-fitting structure 1 of the flexible printed circuit 10 according to the embodiment, the chips fuses 15 are used as the electron components. However, one or more different electronic components may be used, examples thereof including diodes and capacitors.

In the connector-fitting structure 1 of the flexible printed circuit 10 according to the embodiment, the connector cover 26 formed separately from the connector housing 21 is configured to be closed through the locking mechanism. However, the connector cover may be configured to be rotatable through a hinge to be closed.

In the connector-fitting structure 1 of the flexible printed circuit 10 according to the embodiment, the electronic components 15 are sealed by the application of the moisture-proof material as a sealing material S. However, the electronic components 15 may be sealed by the potting of a waterproof material, such as resin, as a sealing material.

What is claimed is:

1. A connector-fitting structure of flexible printed circuit, comprising:
  a flexible printed circuit on which a wiring pattern is formed;
  an electronic component electrically connected to the wiring pattern of the flexible printed circuit; and
  a connector to which only one end part of the flexible printed circuit is fitted, wherein
  the one end part of the flexible printed circuit further includes a contact point portion electrically connected to one end of the wiring pattern and positioned towards a distal end of the connector, the contact point portion is configured to engage with a corresponding contact point portion positioned inside a partner connector of a monitoring unit, the partner connector configured to engage with the connector, and
  wherein the electronic component is positioned towards a proximal end of the connector and the electronic component is housed entirely within the connector.

2. The connector-fitting structure according to claim 1, wherein
  the connector includes a connector housing and a connector cover that covers the connector housing.

3. The connector-fitting structure according to claim 2, wherein the one end part of the flexible printed circuit is positioned between a distal end of the connector housing and a distal end of the connector cover.

4. The connector-fitting structure according to claim 2, wherein
the connector housing further comprises a bottom wall portion, a first side wall portion and a second side wall portion, wherein
the first side wall portion and the second side wall portion are positioned on opposing sides of the bottom wall portion.

5. The connector-fitting structure according to claim 4, further comprising
a first positioning pin that projects vertically from the first side wall portion towards the connector cover, and
a second positioning pin that projects vertically from the second side wall portion towards the connector cover.

6. The connector-fitting structure according to claim 5, wherein
the first positioning pin is fitted through a circular positioning hole in the one end part of the flexible printed circuit, and
the first positioning pin is further fitted through an elliptical positioning hole in the connector cover.

7. The connector-fitting structure according to claim 5, wherein
the second positioning pin is fitted through an elliptical positioning hole in the one end part of the flexible printed circuit, and
the second positioning pin is fitted through a circular portioning hole in the connector cover.

8. The connector-fitting structure according to claim 5, wherein
the first positioning pin and the second positioning pin are positioning on a proximal side of the first side wall portion and the second side wall portion.

9. The connector-fitting structure according to claim 4, wherein
the first side wall portion further includes a first locking plate portion and the second side wall portion further includes a second locking plate portion, and
wherein the first locking plate portion and the second locking plate portion are positioned parallel to each other.

10. The connector-fitting structure according to claim 9, wherein
the first locking plate portion and the second locking plate portion include first locking projections and second locking projections positioned on an exterior of the first locking plate portion and the second locking plate portion.

11. The connector-fitting structure according to claim 10, wherein
the connector cover includes two pairs of locking portions positioned such that the locking portions are configured to engage with the first locking projections and the second locking projections when the connector cover is fitted to the connector housing.

12. The connector-fitting structure according to claim 1, wherein
the electronic component is sealed with a sealing material.

13. The connector-fitting structure according to claim 1, wherein
the electronic component includes a chip fuse.

* * * * *